United States Patent
Kirby et al.

(10) Patent No.: US 11,753,713 B2
(45) Date of Patent: Sep. 12, 2023

(54) METHODS FOR COATING A COMPONENT

(71) Applicant: General Electric Company, Schenectady, NY (US)

(72) Inventors: Glen Harold Kirby, Liberty Township, OH (US); Jeffery Allen Bross, Liberty Township, OH (US); Justin Michael Nagy, Newport, KY (US); Alan David Gerken, Cincinnati, OH (US); Guruvenket Srinivasan, Loveland, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 17/380,444

(22) Filed: Jul. 20, 2021

(65) Prior Publication Data
US 2023/0026324 A1  Jan. 26, 2023

(51) Int. Cl.
*C23C 16/04* (2006.01)
*F01D 5/28* (2006.01)
*C23C 16/56* (2006.01)
*C04B 41/45* (2006.01)
*C23C 16/24* (2006.01)

(52) U.S. Cl.
CPC ........ *C23C 16/042* (2013.01); *C04B 41/4531* (2013.01); *C04B 41/4539* (2013.01); *C04B 41/4572* (2013.01); *C04B 41/4592* (2013.01); *C23C 16/24* (2013.01); *C23C 16/56* (2013.01); *F01D 5/288* (2013.01); *F05D 2230/314* (2013.01); *F05D 2300/6033* (2013.01)

(58) Field of Classification Search
CPC ........ C23C 16/042; C23C 16/24; C23C 16/56
See application file for complete search history.

(56) References Cited

U.S. PATENT DOCUMENTS

| 4,425,407 A | * | 1/1984 | Galasso | C04B 35/83 |
| | | | | 427/249.4 |
| 5,902,647 A | | 5/1999 | Venkataramani et al. | |
| 6,335,078 B2 | | 1/2002 | Venkataramani et al. | |
| 7,147,899 B2 | * | 12/2006 | Fernihough | C23C 4/01 |
| | | | | 427/508 |

(Continued)

FOREIGN PATENT DOCUMENTS

| CN | 105814007 A | * | 7/2016 | ............. C04B 41/89 |
| EP | 0346266 | * | 6/1989 | ............. C23C 10/04 |
| JP | 2016-512810 | * | 5/2016 | ............. C04B 41/89 |

OTHER PUBLICATIONS

Panakarajupally, Ragav P., et al., "Thermomechanical Characterization of SiC/SiC Ceramic Matrix Composites in a Combustion Facility". Ceramics, 2019, 2, 407-425.*

*Primary Examiner* — Bret P Chen
(74) *Attorney, Agent, or Firm* — Dority & Manning, P.A.

(57) ABSTRACT

A method for processing a component is provided and includes masking a first portion of the component with a maskant. The maskant includes a slurry having a plurality of particles in a fluid carrier. The plurality of particles comprises at least one of silicon, carbon, one or more rare earth disilicates, monosilicates or oxides, and combinations thereof. The method includes depositing a silicon-based coating on a second portion of the component via a chemical vapor deposition process and removing the maskant and any overlying silicon-based coating from the first portion of the component.

19 Claims, 3 Drawing Sheets

(56) References Cited

U.S. PATENT DOCUMENTS

| | | | |
|---|---|---|---|
| 7,163,747 B2 | 1/2007 | Cox et al. | |
| 7,192,622 B2* | 3/2007 | Fernihough | C23C 16/042 |
| | | | 427/259 |
| 7,422,771 B2 | 9/2008 | Pietraszkiewicz et al. | |
| 7,544,520 B2 | 6/2009 | Duda et al. | |
| 8,221,825 B2 | 7/2012 | Reitz et al. | |
| 8,859,037 B2* | 10/2014 | Stout | C04B 35/571 |
| | | | 427/229 |
| 8,974,891 B2* | 3/2015 | Riedell | C04B 37/008 |
| | | | 156/289 |
| 9,005,713 B2 | 4/2015 | Tryon et al. | |
| 9,249,490 B2* | 2/2016 | Trzcinski | C23C 4/01 |
| 9,566,603 B2* | 2/2017 | Hlavaty | F01D 5/005 |
| 2005/0100672 A1* | 5/2005 | Stankowski | F01D 5/00 |
| | | | 427/595 |
| 2006/0163773 A1* | 7/2006 | Gray | C04B 35/573 |
| | | | 264/270 |
| 2008/0220165 A1* | 9/2008 | Fairbourn | C23C 6/00 |
| | | | 427/252 |
| 2011/0027556 A1* | 2/2011 | Kirby | C04B 41/009 |
| | | | 428/319.1 |
| 2014/0157595 A1* | 6/2014 | Trzcinski | C23C 4/01 |
| | | | 29/700 |
| 2014/0287143 A1* | 9/2014 | Murphy | C23C 10/38 |
| | | | 427/282 |
| 2017/0073277 A1* | 3/2017 | Shim | F01D 5/288 |
| 2017/0320785 A1* | 11/2017 | Matsumoto | B32B 18/00 |
| 2017/0368803 A1* | 12/2017 | Nelson | C04B 37/005 |
| 2018/0266261 A1 | 9/2018 | Overholser | |
| 2019/0389777 A1* | 12/2019 | Shi | C04B 35/62884 |

\* cited by examiner

METHODS FOR COATING A COMPONENT

FIELD

The present disclosure generally relates to methods for coating components, such as to a process for depositing a coating onto a selective area of a turbine component.

BACKGROUND

Ceramic matrix composites (CMCs) are used for certain components throughout gas turbine engines, and are increasingly used in higher temperature sections of gas turbine engines CMCs are a class of materials that consist of a reinforcing material surrounded by a ceramic matrix phase. These CMCs are lightweight compared to superalloys yet can still provide strength and durability to a component made therefrom. CMC and monolithic ceramic components can be coated with environmental barrier coatings (EBCs) to protect them from the harsh environment of high temperature engine sections. EBCs can provide a dense, hermetic seal against the corrosive gases in the hot combustion environment, which can rapidly oxidize silicon-containing CMCs and monolithic ceramics. Depending on the end use of the CMC component, only a portion of the component may need to be coated with an EBC. Improved coating methods for CMC components are needed to provide such a result.

BRIEF DESCRIPTION OF THE DRAWINGS

The above and other aspects, features, and advantages of the present disclosure will become more apparent in light of the subsequent detailed description when taken in conjunction with the accompanying drawings in which.

DETAILED DESCRIPTION

Figure 1:
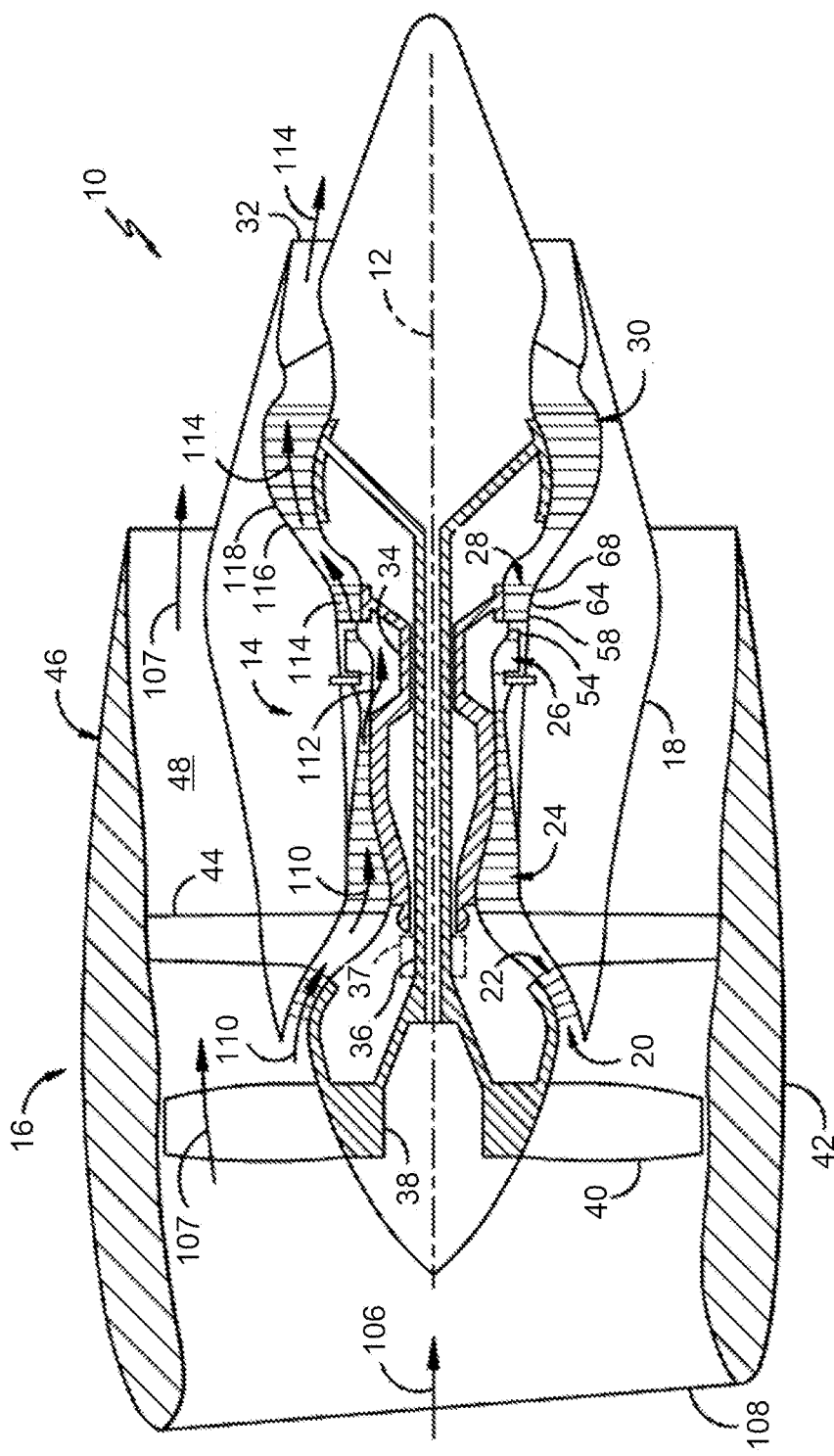
FIG. 1 is a schematic cross-sectional view of a gas turbine engine in accordance with embodiments of the present disclosure.

One or more embodiments of the present disclosure will be described below. Unless defined otherwise, technical, and scientific terms used herein have the same meaning as is commonly understood by one of ordinary skill in the art to which this disclosure belongs.

Approximating language, as used herein throughout the specification and claims, may be applied to modify any quantitative representation that could permissibly vary without resulting in a change in the basic function to which it is related. Accordingly, a value modified by a term or terms, such as "about", are not to be limited to the precise value specified. Additionally, when using an expression of "about a first value–a second value," the about is intended to modify both values. In at least some instances, the approximating language may correspond to the precision of an instrument for measuring the value.

Here, and throughout the specification and claims, range limitations may be combined and/or interchanged, such ranges are identified and include all the sub-ranges contained therein unless context or language indicates otherwise. Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time, and the like is, for example, from 1 to 90, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

The methods and materials described in the present disclosure can include, consist essentially of, or consist of, the components of the present disclosure as well as other materials described herein. As used herein, "consisting essentially of" means that the composition or component may include additional materials, but only if the additional materials to not materially alter the basic and novel characteristics of the claimed methods or compositions.

The singular forms "a," "an," and "the" include plural references unless the context clearly dictates otherwise.

As used herein, the terms "first", "second", and "third" may be used interchangeably to distinguish one component from another and are not intended to signify location or importance of the individual components.

As used herein the term "powder" or the like refers to a collection of particles. The particles may be of any configuration, shape, or size as long as they are suitable for the flowability, dispersion and/or compaction thereof.

As used herein the term "average particle size" or "median particle size" refers to median value of the particle size distribution, also known as d50 median. Also, as used herein, d100 refers to 100% of the volume percent of the particles having diameters with the stated ranges or under the stated value.

Approximating language, as used herein throughout the specification and claims, is applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a 10 percent margin to the stated value.

Embodiments of the present disclosure relate to a method of processing a CMC component. For instance, EBCs deposited on CMC components often require deposition of a silicon bond coat. In order to selectively coat the surfaces of CMC components, hard tool masks are applied to the CMC component in areas where no silicon bond coat is desired. However, during CVD coating processes, the applied silicon coating can actually penetrate between the gaps of the hard tool masks and the component, thus coating undesirable areas. Unlike hard tool masks, the present disclosure provides a slurry-based maskant that makes intimate contact with the CMC component, such that silicon vapors cannot penetrate around the masking and coat the component. The maskant prevents infiltration of silicon coatings deposited by CVD. Advantageously, the methods incorporating the maskant described herein are suitable for use in low pressure CVD processes and are operationally stable in environments in CVD reactors including maintaining operational stability in the temperature, vacuum, and corrosive environments present in CVD reactors. Furthermore, the maskant can be easily removed from the component without affecting the form or function of the component. Accordingly, utilization of the methods and maskants described herein allow for precise application of CVD silicon bond coats.

In some embodiments of the present disclosure, the component includes a gas turbine engine component suitable for used in a gas turbine engine assembly or a gas power turbine assembly. Referring now to the drawings, FIG. 1 is a schematic cross-sectional view of a gas turbine engine herein referred to as "turbofan engine 10" as may incorporate various embodiments of the present disclosure. As shown in FIG. 1, the turbofan engine 10 has a longitudinal or axial centerline axis 12 that extends therethrough for reference purposes. In general, the turbofan engine 10 may include a turbomachine 14 disposed downstream from a fan section 16.

The turbomachine 14 may generally include a substantially tubular outer casing 18 that defines an annular inlet 20. The outer casing 18 may be formed from multiple casings. The outer casing 18 encases, in serial flow relationship, a compressor section having a booster or low pressure (LP) compressor 22, a high pressure (HP) compressor 24, a combustion section 26, a turbine section including a high pressure (HP) turbine 28, a low pressure (LP) turbine 30, and a jet exhaust nozzle section 32. A high pressure (HP) shaft or spool 34 drivingly connects the HP turbine 28 to the HP compressor 24. A low pressure (LP) shaft or spool 36 drivingly connects the LP turbine 30 to the LP compressor 22. The (LP) spool 36 may also be connected to a fan spool 38 of the fan section 16. In particular embodiments, the (LP) spool 36 may be connected directly to the fan spool 38 such as in a direct-drive configuration. In alternative configurations, the (LP) spool 36 may be connected to the fan spool 38 via a speed reduction device 37 such as a reduction gear gearbox in an indirect-drive or geared-drive configuration. Such speed reduction devices may be included between any suitable shafts/spools within turbofan engine 10 as desired or required.

As shown in FIG. 1, the fan section 16 includes a plurality of fan blades 40 that are coupled to and that extend radially outwardly from the fan spool 38. An annular fan casing or nacelle 42 circumferentially surrounds the fan section 16 and/or at least a portion of the turbomachine 14. It should be appreciated by those of ordinary skill in the art that the nacelle 42 may be configured to be supported relative to the turbomachine 14 by a plurality of circumferentially-spaced outlet guide vanes 44. Moreover, a downstream section 46 of the nacelle 42 (downstream of the guide vanes 44) may extend over an outer portion of the turbomachine 14 so as to define a bypass airflow passage 48 therebetween.

During operation of the turbofan engine 10, as illustrated in FIG. 1, air 106 enters an inlet portion 108 of the turbofan engine 10. A first portion of the air 106 as indicated by arrow 107 is directed into the bypass airflow passage 48 and a second portion of the air 106 as indicated by arrow 110 enters the inlet 20 of the LP compressor 22. The second portion of air indicated by arrow 110 is progressively compressed as it is routed from the LP compressor 22 into the HP compressor 24. The second portion of the air indicated by arrow 110 is further compressed as it is routed through the HP compressor 24, thus providing compressed air as indicated by arrow 112 to the combustion section 26 where it is mixed with fuel and burned to provide combustion gases as indicated by arrow 114.

The combustion gases indicated by arrow 114 are routed through the HP turbine 28 where a portion of thermal and/or kinetic energy from the combustion gases indicated by arrow 114 is extracted via the stator vanes 54, 64 and turbine rotor blades 58, 68 of the first and second stages 50, 60 respectively, thus causing the HP shaft or spool 34 to rotate, thereby supporting operation of the HP compressor 24. The combustion gases indicated by arrow 114 are then routed through the LP turbine 30 where a second portion of thermal and kinetic energy is extracted from the combustion gases indicated by arrow 114 via sequential stages of LP turbine stator vanes 116 and LP turbine rotor blades 118 that are coupled to the LP shaft or spool 36, thus causing the LP shaft or spool 36 to rotate, thereby supporting operation of the LP compressor 22 and/or rotation of the fan spool 38. The combustion gases indicated by arrow 114 are then routed through the jet exhaust nozzle section 32 of the turbomachine 14.

As described certain components of the turbofan engine 10 can be fabricated from CMC materials. CMC materials include a composite material, such as a polymer matrix composite (PMC) material or a CMC material, which has high temperature capability. Composite materials generally comprise a fibrous reinforcement material embedded in matrix material, e.g., a polymer or ceramic matrix material. The reinforcement material serves as a load-bearing constituent of the composite material, while the matrix of a composite material serves to bind the fibers together and act as the medium by which an externally applied stress is transmitted and distributed to the fibers.

Exemplary CMC materials may include silicon carbide (SiC), silicon, silica, or alumina matrix materials and combinations thereof. Ceramic fibers may be embedded within the matrix, such as oxidation stable reinforcing fibers including monofilaments like sapphire and silicon carbide (e.g., Textron's SCS-6), as well as rovings and yarn including silicon carbide (e.g., Nippon Carbon's NICALON®, Ube Industries' TYRANNO®, and Dow Corning's SYLRAMIC®), alumina silicates (e.g., 3M's Nextel 440 and 480), and chopped whiskers and fibers (e.g., 3M's Nextel 440 and SAFFIL®), and optionally ceramic particles (e.g., oxides of Si, Al, Zr, Y, and combinations thereof) and inorganic fillers (e.g., pyrophyllite, wollastonite, mica, talc, kyanite, and montmorillonite). For example, in certain embodiments, bundles of the fibers, which may include a ceramic refractory material coating, are formed as a reinforced tape, such as a unidirectional reinforced tape. A plurality of the tapes may be laid up together (e.g., as plies) to form a preform component. The bundles of fibers may be impregnated with a slurry composition prior to forming the preform or after formation of the preform. The preform may then undergo thermal processing, such as a cure or burn-out to yield a high char residue in the preform, and subsequent chemical processing, such as melt-infiltration with silicon, to arrive at a component formed of a CMC material having a desired chemical composition. In other embodiments, the CMC material may be formed as, e.g., a carbon fiber cloth rather than as a tape.

Figure 2:
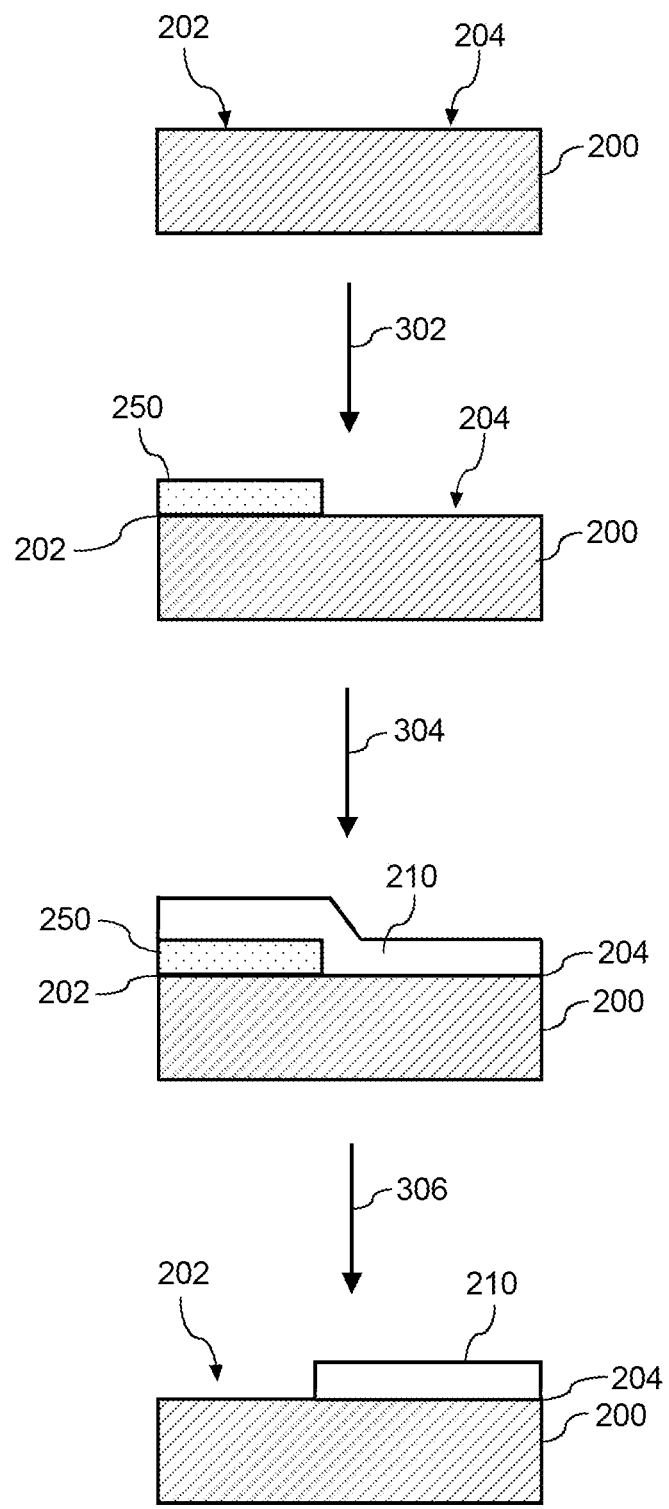
FIG. 2 illustrates a component having maskant and coating applied thereon in accordance with embodiments of the present disclosure.
Figure 3:
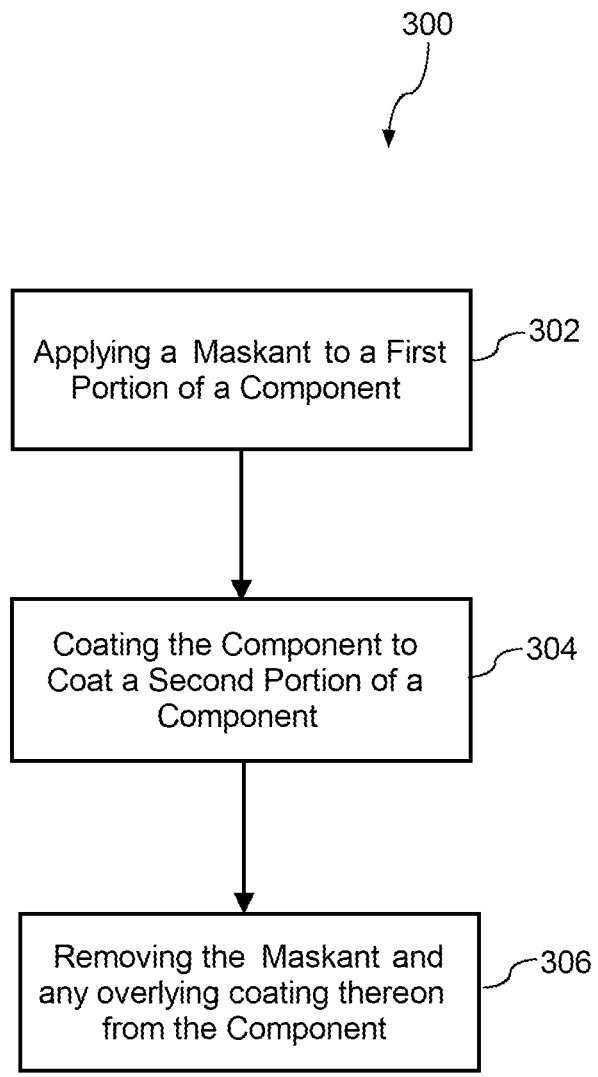
FIG. 3 illustrates a flow-chart for a method for coating a component in accordance with example embodiments of the present disclosure.

FIG. 2 illustrates an exemplary component 200 formed from a CMC material that is treated according to exemplary processes described herein, particularly with respect to the method 300 as shown by FIG. 3. The component 200 includes a first portion 202 and a second portion 204. At, 302, a maskant 250 is applied to the first portion 202, as will be described in more detail hereinbelow. As shown, the component 200 includes a first portion 202 coated with maskant 250 and a second portion 204 that is not coated with maskant 250. At 304, a coating 210 is applied to the component 200. The coating 210 is prevented from accessing the surface of the first portion 202 of the component 200 by the maskant 250. However, the coating 210 can be applied directly to the surface of the second portion 204 of the component 200. The coating 210 can be a silicon coating, such as a silicon bond coat used in EBC systems, that is applied via a CVD process. At 306, the maskant 250 and coating 210 on the first portion 202 are removed, thus providing a partially coated component 200 having only the second portion 204 coated with coating 210.

Similar to FIG. 2, FIG. 3 illustrates an exemplary flowchart process of method 300 for coating certain portions of a component, such as a turbofan engine component. At 302, a first portion of the surface of the component is coated with a maskant leaving at least a second portion of the component uncoated by the maskant. According to embodiments, the maskant can be formulated as a slurry including particulate material dispersed in a fluid carrier. The composition of the slurry material, including the specific particulate material utilized and additives added, is formulated such that coatings applied by CVD processes are unable to penetrate the maskant and prevent the coating from depositing on the component under the maskant.

The slurry material can include one or more powders or particulate material in a fluid carrier. The particulate material can include silicon (Si), carbon (C), silicon oxide ($SiO_2$), zirconium oxide ($ZrO_2$) unstabilized or stabilized with additions of other oxides including but not limited to MgO and $Y_2O_3$, hafnium oxide ($HfO_2$) unstabilized or stabilized with additions of other oxides including but not limited to MgO and $Y_2O_3$, mullite ($3Al_2O_3\text{-}2SiO_2$), rare earth disilicates ($Ln_2Si_2O_7$), rare earth monosilicates ($LnSiO_5$), rare earth oxides ($LnO_x$), where Ln is Scandium (Sc), Yttrium (Y), Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), Lutetium (Lu), or combinations thereof, rare earth monosilicates ($Ln_2SiO_5$) where Ln is Scandium (Sc), Yttrium (Y), Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), Lutetium (Lu), or combinations thereof. In certain embodiments, the particulate material comprises silicon (Si), carbon (C), yttrium disilicate ($Y_2Si_2O_7$), ytterbium disilicate ($Yb_2Si_2O_7$), and combinations thereof.

In some embodiments, the particles have an average particle size (e.g., d50) between 0.3 μm and 3 μm. In certain embodiments, the plurality of particles have a d100 between 3 μm and 300 μm. In still other embodiments, the average particle size (e.g., d50) is 0.02 μm and the d100 is less than 1 μm.

The particulate material can be included in the slurry in an amount of from about 0.1% to about 64% by volume, such as from about 5% to about 50% by volume, such as from about 10% to about 40% by volume, such as from about 15% to about 35% by volume.

The slurry can further include various slurry components, including but not limited to fluid carriers, such as organic solvents, dispersants, binders, plasticizers, and any combinations thereof. Suitable fluid carriers can include water, alcohol, ketone, acetate, acetoacetate, xylene, toluene, benzene, ethyl benzene, alkane, nitric acid, acetic acid, esters, ethers and mixtures or combinations thereof.

In certain embodiments, one or more dispersants can be included in the slurry. For instance, the dispersant can be included in an amount of from about 0.1% to about 20% of the total particle volume. The dispersant may comprise an anionic polyelectrolyte based on ionizable carboxylic acid (e.g., polyacrylic acid), sulfonic acid, or phosphoric acid groups, a cation polyelectrolyte based on protonizable imine groups (e.g., polyethylene imine), or non-charged polymer, such as a non-charged polymer that may adsorb to the particles, such as but not limited to fatty acids (e.g., fish oil), polyvinyl pyrrolidone, and polyethylene oxide.

In other embodiments, one or more binders can be included in the slurry. For instance, the slurry can include from about 5% to about 50% of binder based on the total volume of the particles present in the slurry. Suitable binders include, but are not limited to, polyvinyl butyral, latex binders, or any other binder that is known by one skilled in the art of ceramic processing. In certain embodiments, a combination of a binder and a plasticizer can be included in the slurry. In such embodiments, one or more plasticizers can be added in an amount of from about 1% to about 300% of the volume of the binder in the slurry. Plasticizers include any low vapor pressure fluids in which the binder is soluble. Examples include di(propylene glycol) dibenzoate, dibutyl phthalate, esters, and many other fluids known by those skilled in the art of ceramic processing.

The slurry can be formed by combining any or all of the previously described slurry components with mixing media in a container. The mixture can be mixed using conventional techniques known to those skilled in the art such as shaking with up to about a 1 inch (about 25.4 mm) diameter alumina or zirconia mixing media, ball milling using about a 0.25 inch to about a 1 inch (about 0.64 cm to about 2.54 cm) diameter alumina or zirconia mixing media, attritor milling using about a 1 mm to about a 5 mm diameter zirconia-based mixing media, planetary ball milling using from about a 1 mm to about a 5 mm diameter zirconia-based media, or mechanical mixing or stirring with simultaneous application of ultrasonic energy. The mixing media or ultrasonic energy can break apart any agglomerated ceramic particles in the slurry. Any mixing media present may then be removed by straining, for example.

Once prepared, the slurry can be directly applied to the component on portions of the component where deposition of the coating is not desired. For example, the slurry can be applied to the component by pouring, painting, rolling, spraying, dipping, dipping and spinning, doctor blading, or any application method known by one skilled in the art. The slurry can be applied at a thickness ranging from about 0.1 mils to about 100 mils, such as from about 0.5 mils to about 5 mils. In embodiments, the slurry is dried at room temperature or at a slightly elevated temperature above 30° C. to remove fluid by evaporation and to form a masked component. In another embodiment, the slurry is tape cast onto a mylar film and dried. The dried slurry tape is the transferred to the component and attached by slight heat and pressure to form the masked component.

At (304), a coating material is applied to the component. The coating material can be applied to, deposited or otherwise formed on surfaces of the component via any process suitable for forming layers of silicon, including vapor phase deposition techniques, pack cementation techniques, high velocity oxy-fuel (HVOF) techniques, physical vapor deposition (PVD) techniques such as electron beam physical vapor deposition (EB-PVD), ion plasma, etc., thermal spray techniques such as plasma spray (e.g., air plasma spray), etc., chemical vapor deposition (CVD) techniques, etc., or as well known to those skilled in the art. The silicon coating can be applied by placing the masked component in a CVD reactor and coating the component with silicon metal. Once the silicon coating is deposited, the component can be removed from the CVD reactor and further processed.

At (306), the maskant and overlying portion of coating can be removed from the component rendering a partially coated component. For example, in certain embodiments the coated component can be exposed to a grit blast procedure for removing a portion of the maskant and overcoated silicon coating. For example, the maskant and overlying coating can be removed by grit blasting where the surface of the component is subjected to the abrasive action of silicon carbide particles, steel particles, alumina particles, or other types of abrasive particles. The abrasive particles can be selected to have particular sizes depending on the type of coating and maskant to be removed. In certain embodiments, the maskant and overlying coating are removed via dry ice blasting. In such procedures, dry ice (i.e., the solid form of carbon dioxide) is pressurized in an air stream and accelerated at a surface of the component. Dry ice blasting is similar to other grit blasting procedures, except that solid carbon dioxide is used as the particulate media, which results in a less abrasive procedure.

Further aspects of the disclosure are provided by the subject matter of the following clauses:

A method for processing a component, comprising: masking a first portion of a component with a maskant, the maskant including a slurry having a plurality of particles in a fluid carrier, wherein the plurality of particles comprises at least one of silicon, carbon, one or more rare earth disilicates, monosilicates or oxides, or combinations thereof, wherein a second portion of the component is not contacted by the maskant; depositing a silicon-based coating on the component via a chemical vapor deposition process on a second portion of the component, wherein the maskant prevents deposition of the silicon-based coating on the first portion of the component; and removing the maskant and a portion of the silicon-based coating overlaying the maskant from the first portion of the component.

The method of any preceding clause, wherein the plurality of particles have an average particle size between 0.3 µm and 3 µm.

The method of any preceding clause, wherein the plurality of particles are present in the slurry in an amount of from about 0.1 volume % to about 64 volume %.

The method of any preceding clause, wherein the fluid carrier comprises water, alcohol, ketone, acetate, acetoacetate, xylene, toluene, benzene, ethyl benzene, alkane, nitric acid, acetic acid, esters, ethers, or a combination thereof.

The method of any preceding clause, wherein the slurry further comprises a dispersant.

The method of any preceding clause, wherein the slurry comprises from about 0.1 volume % to 20 volume % of the dispersant based on a total particle volume of the slurry.

The method of any preceding clause, wherein the dispersant comprises (i) an anionic polyelectrolyte based on ionizable carboxylic acid, sulfonic acid, or phosphoric acid groups, (ii) a cation polyelectrolyte based on protonizable imine groups, (iii) a non-charged polymer, or a combination thereof.

The method of any preceding clause, wherein (iii) the non-charged polymer comprises fatty acids, polyvinyl pyrrolidone, polyethylene oxide, or a combination thereof.

The method of any preceding clause, wherein the slurry further comprises one or more binders.

The method of any preceding clause, wherein the slurry includes from about 5 volume % to about 50 volume % of binder based on a total volume of the plurality of particles.

The method of any preceding clause, wherein the one or more binders comprise polyvinyl butyral, latex binders, or combinations thereof.

The method of any preceding clause, wherein the slurry further comprises one or more plasticizers.

The method of any preceding clause, wherein the slurry includes from about 1% to about 300% of the one or more plasticizers based on a volume of a binder.

The method of any preceding clause, wherein the one or more plasticizers comprise di(propylene glycol) dibenzoate, dibutyl phthalate, esters, or a combination thereof.

The method of any preceding clause, wherein the slurry is applied at a thickness of from about 0.1 mils to about 100 mils.

The method of any preceding clause, comprising drying the slurry at an elevated temperature to remove at least a portion of the fluid carrier from the slurry.

The method of any preceding clause, wherein removing the maskant and the portion of the silicon-based coating overlaying the first portion of the component utilizes a grit blasting treatment.

The method of any preceding clause, wherein the component comprises a ceramic matrix composite material.

The method of any preceding clause, wherein the component comprises a gas turbine engine component.

The method of any preceding clause, wherein the gas turbine engine component comprises nozzles, blades, turbine center frames, stators, or combinations thereof.

This written description uses examples to describe the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for processing a component, comprising:
   masking a first portion of a component with a maskant, wherein the component comprises a ceramic matrix composite material, the maskant including a slurry having a plurality of particles in a fluid carrier, wherein the plurality of particles comprises at least one of silicon, carbon, one or more rare earth disilicates, monosilicates or oxides, or combinations thereof, wherein a second portion of the component is not contacted by the maskant;
   depositing a silicon-based coating via a chemical vapor deposition process on the second portion of the component, wherein the maskant prevents deposition of the silicon-based coating on the first portion of the component; and
   removing the maskant and a portion of the silicon-based coating overlaying the maskant from the first portion of the component.

2. The method of claim 1, wherein the plurality of particles has an average particle size between 0.3 µm and 3 µm.

3. The method of claim 1, wherein the plurality of particles is present in the slurry in an amount of from about 0.1 volume % to about 64 volume %.

4. The method of claim 1, wherein the fluid carrier comprises water, alcohol, ketone, acetate, acetoacetate, xylene, toluene, benzene, ethyl benzene, alkane, nitric acid, acetic acid, esters, ethers, or a combination thereof.

5. The method of claim 1, wherein the slurry further comprises a dispersant.

6. The method of claim 5, wherein the slurry comprises from about 0.1 volume % to 20 volume % of the dispersant based on a total particle volume of the slurry.

7. The method of claim 5, wherein the dispersant comprises (i) an anionic polyelectrolyte based on ionizable carboxylic acid, sulfonic acid, or phosphoric acid groups, (ii) a cation polyelectrolyte based on protonizable imine groups, (iii) a non-charged polymer, or a combination thereof.

8. The method of claim 7, wherein (iii) the non-charged polymer comprises fatty acids, polyvinyl pyrrolidone, polyethylene oxide, or a combination thereof.

9. The method of claim 1, wherein the slurry further comprises one or more binders.

10. The method of claim 9, wherein the slurry includes from about 5 volume % to about 50 volume % of binder based on a total volume of the plurality of particles.

11. The method of claim 9, wherein the one or more binders comprise polyvinyl butyral, latex binders, or combinations thereof.

12. The method of claim 1, wherein the slurry further comprises one or more plasticizers.

13. The method of claim 12, wherein the slurry includes from about 1% to about 300% of the one or more plasticizers based on a volume of a binder.

14. The method of claim 12, wherein the one or more plasticizers comprise di(propylene glycol) dibenzoate, dibutyl phthalate, esters, or a combination thereof.

15. The method of claim 1, wherein the slurry is applied at a thickness of from about 0.1 mils to about 100 mils.

16. The method of claim 1, comprising drying the slurry at an elevated temperature to remove at least a portion of the fluid carrier from the slurry.

17. The method of claim 1, wherein removing the maskant and the portion of the silicon-based coating overlaying the first portion of the component utilizes a grit blasting treatment.

18. The method of claim 1, wherein the component comprises a gas turbine engine component.

19. The method of claim 18, wherein the gas turbine engine component comprises a nozzle, a blade, a turbine center frame, a stator, or a combination thereof.

* * * * *